(12) United States Patent
Yang et al.

(10) Patent No.: US 10,879,658 B2
(45) Date of Patent: Dec. 29, 2020

(54) LOAD CONNECTORS FOR POWER PANEL ASSEMBLIES

(71) Applicant: Hamilton Sundstrand Corporation, Charlotte, NC (US)

(72) Inventors: Nhia Yang, Loves Park, IL (US); Jeffrey T. Wavering, Rockford, IL (US); Stephen E. Jackson, Rockford, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 136 days.

(21) Appl. No.: 16/119,442

(22) Filed: Aug. 31, 2018

(65) Prior Publication Data

US 2020/0076142 A1 Mar. 5, 2020

(51) Int. Cl.
*H01R 25/16* (2006.01)
*H01R 4/02* (2006.01)

(52) U.S. Cl.
CPC ............ *H01R 25/162* (2013.01); *H01R 4/02* (2013.01)

(58) Field of Classification Search
CPC .................................................. H01R 25/162
USPC ............................ 439/247, 248, 61; 361/788
See application file for complete search history.

(56) References Cited

U.S. PATENT DOCUMENTS

| | | | | |
|---|---|---|---|---|
| 3,368,117 A | * | 2/1968 | Pond | G06F 1/18 361/801 |
| 4,072,379 A | * | 2/1978 | Towne | H01R 25/006 439/65 |
| 4,164,362 A | * | 8/1979 | Cobaugh | H01R 13/514 439/64 |
| 4,337,499 A | * | 6/1982 | Cronin | H05K 7/20554 361/679.54 |
| 4,463,408 A | * | 7/1984 | Kleinecke | H02B 1/36 200/50.24 |
| 4,717,344 A | * | 1/1988 | Schempp | H01R 12/7088 361/775 |
| 4,862,326 A | * | 8/1989 | Blomstedt | H05K 7/1457 361/788 |
| 5,086,372 A | * | 2/1992 | Bennett | H01R 12/7088 361/622 |
| 5,139,426 A | * | 8/1992 | Barkus | H01R 12/7088 439/108 |

(Continued)

FOREIGN PATENT DOCUMENTS

DE 102006050288 A1 4/2008

OTHER PUBLICATIONS

Extended European search report issued in corresponding EP application No. 19194762.1, dated Feb. 3, 2020.

*Primary Examiner* — Neil Abrams
(74) *Attorney, Agent, or Firm* — Locke Lord LLP; Daniel J. Fiorello; Scott D. Wofsy

(57) ABSTRACT

A power panel for an electrical system includes a chassis having chassis slots for power modules, a bus body coupled to the chassis to connect the power panel to a power source, and first and second module connectors. The first and second module connectors are fixed relative to the bus body to connect the power modules to the bus body. The second module connector is movable relative to the first module connector to accommodate position of the power modules in the chassis slots. Electrical cabinets, power panels, and methods of seating power modules in power panels are also described.

20 Claims, 5 Drawing Sheets

(56) References Cited

U.S. PATENT DOCUMENTS

| | | | | |
|---|---|---|---|---|
| 5,227,957 | A * | 7/1993 | Deters | G06F 1/181 |
| | | | | 312/223.2 |
| 5,282,112 | A * | 1/1994 | Bremer | H05K 3/222 |
| | | | | 361/633 |
| 5,288,246 | A * | 2/1994 | Whiteman, Jr. | H01R 13/629 |
| | | | | 439/498 |
| 5,376,011 | A * | 12/1994 | Rudy, Jr. | H01R 13/629 |
| | | | | 439/248 |
| 5,525,063 | A * | 6/1996 | McMichen | H05K 7/1459 |
| | | | | 439/61 |
| 5,969,938 | A * | 10/1999 | Byrne | H05K 7/1457 |
| | | | | 361/614 |
| 6,205,029 | B1 * | 3/2001 | Byrne | H05K 7/1457 |
| | | | | 174/68.2 |
| 6,344,975 | B1 * | 2/2002 | Gayle | H01R 4/14 |
| | | | | 361/785 |
| 6,504,730 | B1 | 1/2003 | Cooney et al. | |
| 7,417,848 | B2 * | 8/2008 | Bergmann | H01R 25/16 |
| | | | | 337/191 |
| 7,458,837 | B2 * | 12/2008 | Mineo | G01R 1/0416 |
| | | | | 324/756.05 |
| 7,458,862 | B2 | 12/2008 | Zhao et al. | |
| 7,507,099 | B2 * | 3/2009 | Cowgill | G01R 1/0416 |
| | | | | 439/248 |
| 7,857,669 | B1 | 12/2010 | Wavering | |
| 8,721,368 | B2 | 5/2014 | Zhao | |
| 9,431,783 | B1 * | 8/2016 | Costello | H01R 12/7088 |
| 9,801,301 | B1 * | 10/2017 | Costello | H04Q 1/15 |
| 10,383,246 | B2 * | 8/2019 | Deshayes | H02G 3/081 |
| 2017/0181310 | A1 | 6/2017 | Deshayes | |
| 2020/0076142 | A1 * | 3/2020 | Yang | H01R 25/162 |

* cited by examiner

LOAD CONNECTORS FOR POWER PANEL
ASSEMBLIES

BACKGROUND OF THE INVENTION

1. Field of the Invention

The present disclosure relates to electrical power distribution, and more particularly to load connectors for power modules in power panel assemblies.

2. Description of Related Art

Vehicles, such as an aircraft, commonly employ switches that route power to various electrical subsystems and electrical devices. The switches are typically mounted on cards, which seat within a card cage and receive power from a connection to a common power supply. Power is generally provided through cabling, which provides an indirect power routing, or pins, which can provide a direct power routing.

The indirect routing provided by cabling provides flexibility during assembly of the card cage as variation of the location of a given card can be accommodated by the route taken by the cabling. This generally results in a larger, heavier card cage arrangement than possible with a direct routing arrangement, such as that provided by pin connectors, which are typically soldered or press-fit into a rigid bus bar. However, because pin connectors are typically fixed to one another by the rigid bus bar, pin connectors generally are intolerant of variation in the position of cards. When card position deviates from a set distance due to manufacturing variation or shifts due to heating side loadings can develop in the pins, potentially causing hot spots at various locating in the card cage unless managed by tolerancing and/or thermal management.

Such conventional methods and systems have generally been considered satisfactory for their intended purpose. However, there is still a need in the art for improved power modules, power distribution assemblies, and methods of making power distribution assemblies. The present disclosure provides a solution for this need.

SUMMARY OF THE INVENTION

A power panel for an electrical system includes a chassis having chassis slots for power modules, a bus body coupled to the chassis to connect the power panel to a power source, and first and second module connectors. The first and second module connectors are fixed relative to the bus body to connect the power modules to the bus body. The second module connector is movable relative to the first module connector to accommodate position of the power modules in the chassis slots.

In certain embodiments the first module connector can be radially free relative to a first of the chassis slots. The first module connector can be axially free relative to the first of the chassis slots. The first module connector can be both axially free and radially free relative to the first of the chassis slots. The second module connector can be radially free relative to a second of the chassis slots. The second module connector can be axially free relative to the second of the chassis slots. The first module connector can be both axially free and radially free relative to the second of the chassis slots. A power module can be seated one of the chassis slots. The power module can be in electrical communication with the bus body by one of the first and second power module connectors.

In accordance with certain embodiments, the bus body can have a flexible body. The flexible body can laterally span the chassis slots. The flexible body can include a ribbon stack. A terminal can be arranged on an end of the bus body for connecting the bus body to a power supply. The terminal can be fixed relative to the chassis. A buckle can connect the terminal in series with the bus body. The terminal can be brazed to the buckle. The bus body can include a ribbon segment. The ribbon segment can be captive within the buckle and electrically connected to the terminal by the buckle. The module connector can include a plug body. The plug body can be fixed relative to the bus body. The plug body can be connected in series with the bus body by the buckle. It is contemplated that the plug body can be brazed and/or fastened to the buckle.

It is also contemplated that, in accordance with certain embodiments, the bus body can include a ribbon segment. The ribbon segment can be captive within the buckle. The ribbon segment can be connected to the plug body by the buckle. The ribbon segment can be a singular ribbon segment captive within the buckle. The ribbon segment can be doubled with another ribbon segment also captive within the buckle. A cover with apertures can enclose the bus body. The first module connector can extend through a first of the plug apertures. The first module connector can be movably supported relative to the cover within the first of the plug apertures. The second module connector can extend through a second of the plug apertures. The second module connector can be movably supported relative to the cover within the second of the plug apertures.

An electrical cabinet includes a power panel as described above. The first module connector is radially and axially free relative to a first of the chassis slots, the second module connector is radially and axially free relative to a second of the chassis slots, and the bus body has a flexible body spanning the laterally spanning the chassis slots. A terminal is arranged on an end of the bus body for connecting the bus body to a power supply and is fixed relative to the chassis. A cover having plug apertures encloses the bus body, the first module connector extending through a first of the plug apertures and movably supported relative to the cover, the second module connector extending through a second of the plug apertures and movably supported relative to the cover.

In certain embodiments the first module connector can include a plug body fixed relative to the bus body and the bus body can includes a ribbon segment captive within the buckle and electrically connected to the plug body by the buckle. The ribbon segment can doubled with another ribbon segment captive within the buckle. The ribbon segment can be a singular ribbon segment captive within the buckle.

A method of seating a power module in a power panel as described above includes seating a power module in a first of chassis slots and sliding the power module along the chassis slot. The power module is slid into abutment with the second module connector and the second module connector moved relative to the first module connector with the sliding movement of the power module. The second module can be radially displaced relative to the first module connector by the sliding movement of the power module. The second module can be axially displaced relative to the first module connector by the sliding movement of the power module. The second module can be radially displaced relative to the chassis by the sliding movement of the power module. The second module can be axially displaced relative to the chassis by the sliding movement of the power module.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION OF THE PREFERRED EMBODIMENTS

Figure 1:
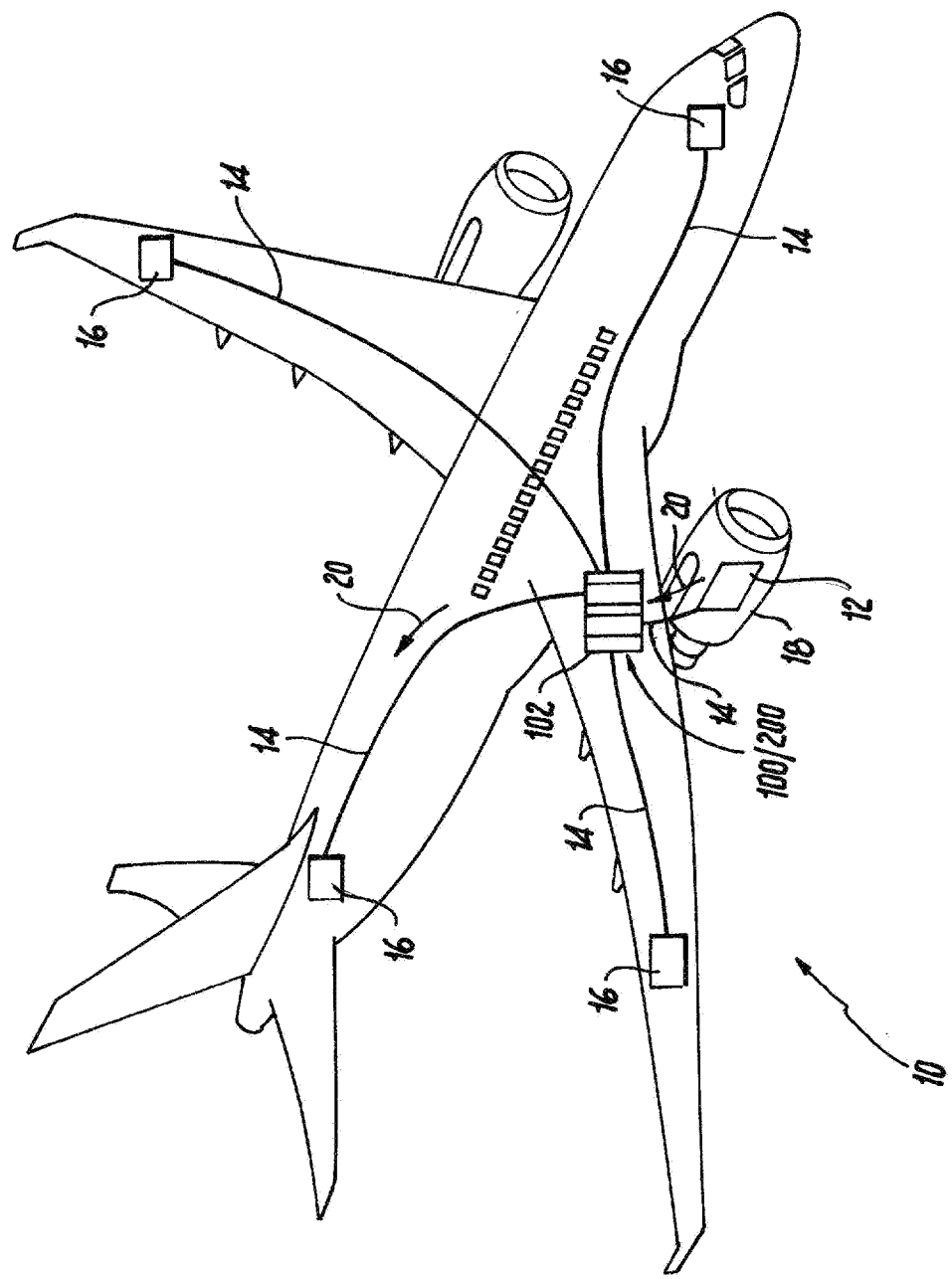
FIG. 1 is a schematic view of an exemplary embodiment of an aircraft electrical system constructed in accordance with the present disclosure, showing an electrical cabinet having a power panel positioned within the electrical cabinet and routing power to electrical devices and subsystems of the aircraft.

Reference will now be made to the drawings wherein like reference numerals identify similar structural features or aspects of the subject disclosure. For purposes of explanation and illustration, and not limitation, a partial view of an exemplary embodiment of a power panel in accordance with the disclosure is shown in FIG. 1 and is designated generally by reference character 100. Other embodiments of power panels, power panel assemblies, and methods of making power panels in accordance with the disclosure, or aspects thereof, are provided in FIGS. 2-5, as will be described. The systems and methods described herein can be used electrical systems, such as power distribution systems on aircraft, though the present disclosure is not limited to aircraft or to power distribution systems in general.

Referring to FIG. 1, an electrical system 10, e.g., an aircraft electrical system, is shown. Electrical system 10 includes a generator 12, a power bus 14, and a plurality of electrical devices and subsystems 16. Generator 12 is operably associated with an engine 18, e.g., an aircraft main engine or auxiliary power unit, and is arranged to provide a flow of electrical power 20 to power bus 14. Power bus 14 is connected to respective power-consuming devices 16 through bus body 106 (shown in FIG. 4), which is mounted to power panel 100 to form an electrical cabinet 200. Although an aircraft electrical system is shown in the illustrated exemplary embodiment, it is to be understood and appreciated that electrical systems in other types of vehicles as well as non-vehicular applications can also benefit from the present disclosure.

Figure 2:
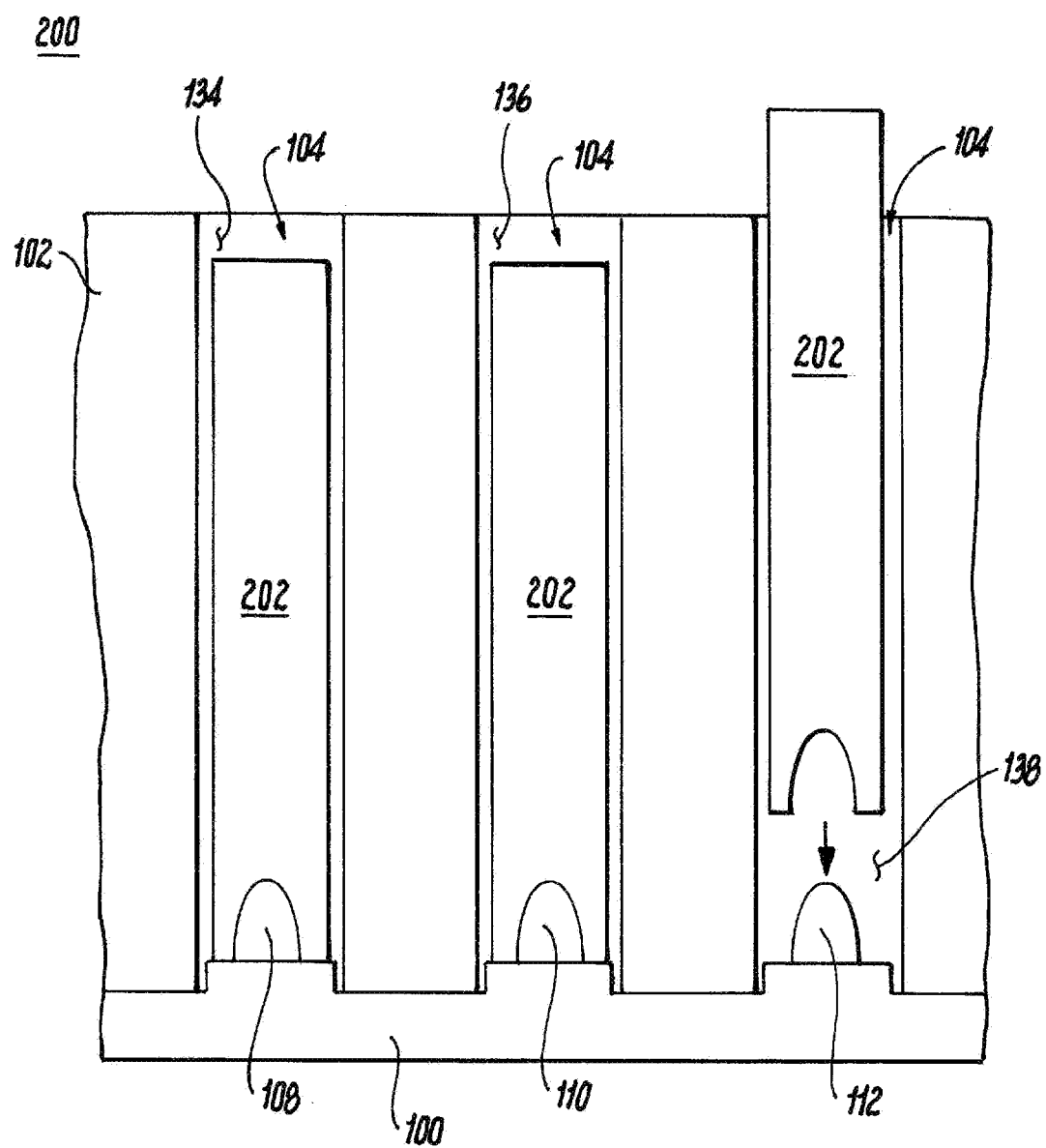
FIG. 2 is a schematic view of the electrical cabinet of FIG. 1, showing a power module being slidably seated in the power panel.

With reference to FIG. 2, electrical cabinet 200 is shown. Electrical cabinet 200 includes power panel 100 and a plurality of power modules 202. Power panel 100 includes a chassis 102 with chassis slots 104 for power modules 202, a bus body 106 (shown in FIG. 4) coupled to chassis 102 to connect power panel 100 to a power source, e.g., generator 12 (shown in FIG. 1), and two or more module connectors. In the illustrated exemplary embodiment a first module connector 108, a second module connector 110, and a third module connector 112 are each fixed relative to bus body 106 to connect power modules 202 to bus body 106 (shown in FIG. 4). At least one of the plurality of module connectors, e.g., first module connector 108 is movable relative another of the plurality of module connectors, e.g., second module connector 110 and third module connector 112, to accommodate position of power modules 202 seated in respective chassis slots 104.

Figure 3:
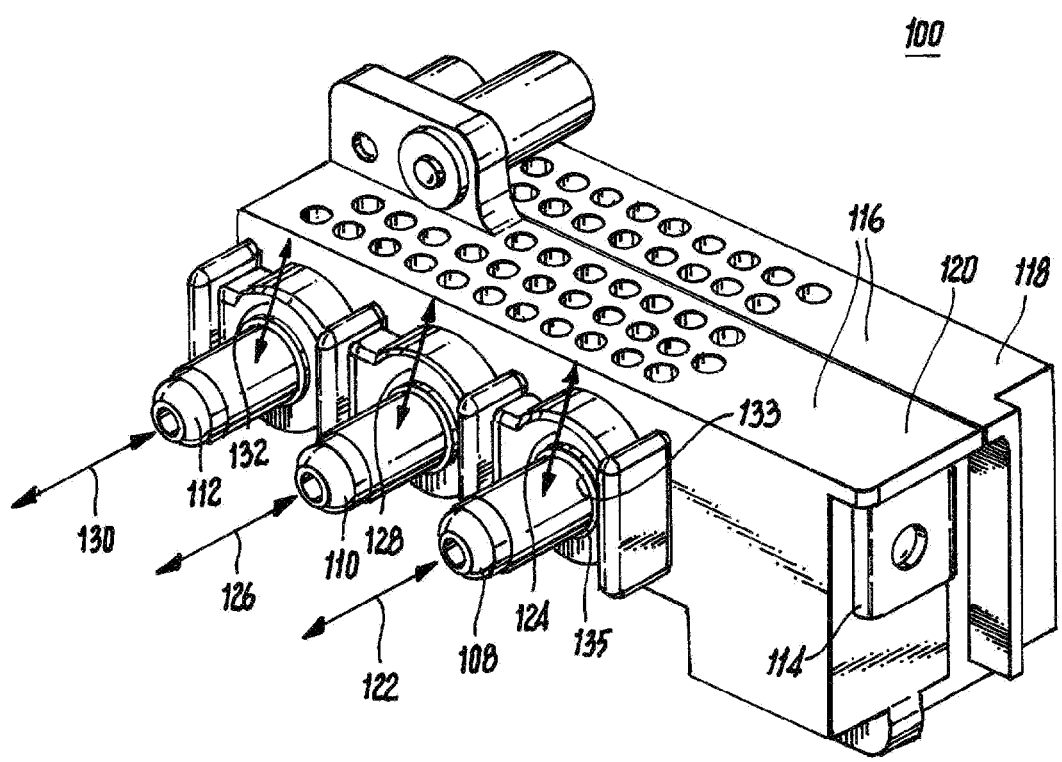
FIG. 3 is a perspective view of the power panel of FIG. 1, showing power module connectors and a terminal supported within a cover of the power panel.

With reference to FIG. 3, power panel 100 is shown according to an exemplary embodiment. Power panel 100 includes a terminal 114 and a cover 116. Cover 116 is constructed from an electrically insulating material 117. In certain embodiments insulating material 117 is a polymeric material. In accordance with certain embodiments insulating material 117 is a fiberglass-reinforced polymeric material. Examples of suitable fiberglass-reinforced polymeric materials include Ryton® R-4, available from the Chevron Phillips Chemical Company LP of The Woodlands, Tex.

Terminal 114 has a supply socket that is configured and adapted to seat a power lead from a power source, e.g., generator 12. Cover 116 is segmented an includes a first section 118 and a second section 120. Second section 120 is fixed to first section 118 and has an aperture for seating terminal 114 and apertures for receiving each of the plurality of module connectors. Second section 120 and terminal 114 are each fixed relative to first section 118.

Figure 4:
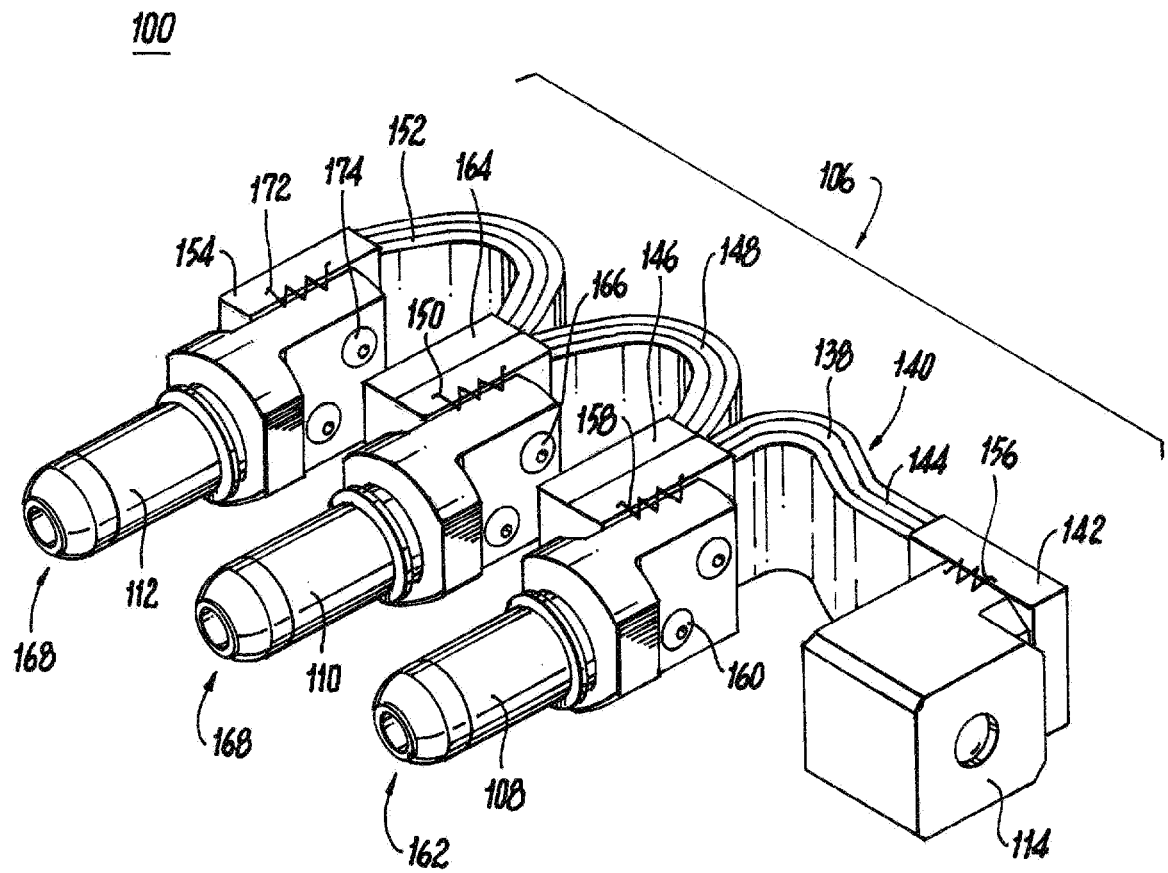
FIG. 4 is a perspective view of the power panel of FIG. 1 with the cover removed, showing a bus body including a flexible body and buckles.

Each of the module connectors, e.g., module connectors 108-112 is movable relative to cover 116 and one another. More specifically first module connector 108 is free relative to cover 116 the other module connectors, first module connector 108 being movable in both the axial direction 122 and radial direction 124 relative to cover 116. Second module connector 110 is also free relative to cover 116 the other module connectors, second module connector 110 being movable in both the axial direction 126 and radial direction 128 relative to cover 116. Third module connector 112 is additionally free relative to cover 116 and to the other module connectors, third module connector 114 being movable in both the axial direction 130 and radial direction 132 relative to cover 116. Radial freedom (i.e. radial float) is provided by clearance 133 between each of the module connectors and the aperture receiving the respective module connector. Axial freedom (i.e. axial float) is provided by axial spacing between a clip 135 seated on each module connector and cover 116. As shown in FIG. 4, clip 135 is axially apart from a face portion 137 of first module connector 108, second module connector 110 and third module connector 112 each having clip spaced apart from a face to allow for axial movement of the respective module connector.

With continuing reference to FIG. 2, it is contemplated that power panel 100 be fixed relative to chassis 102. As a consequence, first module connector 108 is both axially free and radially free relative to a first chassis slot 134. This allows power module 202 received within first chassis slot 134 to axially displace and/or radially displace first module connector 108 as power module 202 is seated within first chassis slot 134 and slid into abutment with first module connector 108 when installed, without disturbing the position of second module connector 110 and third module connector 112. As a consequence, power module 202 can be placed in electrical communication with bus body 106 by first power module connector 108 without exerting side loadings in between the other power module connectors, such as from manufacturing variation and/or due to heating during operation. This can reduce (or eliminate entirely) hot spots within electrical cabinet 200 that could otherwise result from such side loadings. Second module connector 110 and third module connector 112 are similar to first module connector 108, second module connector 110 being axially and radially free relative to a second chassis slot 136 third module connector 112 being axially and radially free relative to third chassis slot 138.

With reference to FIG. 4, power panel 100 is shown with cover 116 (shown in FIG. 3) removed. Bus body 106 has a flexible body 140 including a terminal buckle 142, a first bus body segment 144, a first module connector buckle 146, and a second bus body segment 148. Bus body 106 also includes a second module connector buckle 150, a third bus body segment 152, and a third module connector buckle 154. Bus body 106 laterally spans the chassis slots 134-138 of chassis 102 (shown in FIG. 2), third bus body segment 152 extending between second chassis slot 136 and third chassis slot 138, and second bus body segment 148 extending between first chassis slot 134 and second chassis slot 136.

Flexible body 140 is configured to allow first module connector 108, second module connector 110, and third module connector 112 to move relative to chassis slots 134-138 and/or independently relative to one another. This allows power modules connected to the module connectors to float relative to one another, thereby accommodating manufacture and assembly variation in a given power panel as well as accommodate movement from operational factors, such as heating. In certain embodiments flexible body 140 includes a ribbon or a ribbon stack formed from a conductive material. In accordance with certain embodiments flexible body 140 includes a braided body or braided body stack 139 formed from a conductive materials. Examples of suitable conductive materials include copper and copper alloys by way of non-limiting example.

Terminal 114 is arranged on an end of bus body 106 and is fixed to terminal buckle 142. Fixation of terminal 114 to terminal buckle 142 connects terminal buckle 142 electrically in series with terminal buckle 142. In certain embodiments terminal 114 is fixed to terminal buckle 142 by a braze material, e.g., braze 156. First bus body segment 146 is seated in terminal buckle 142 and is connected electrically in series with terminal 114 through terminal buckle 142.

First module connector buckle 146 is connected on an end of first bus body segment 144 opposite terminal buckle 142 through first bus body segment 144, and is connected electrically therethrough with terminal buckle 142. First module connector 108 is fixed first module connector buckle 146. Fixation of first module connector 108 to first module connector buckle 146 can be through braze 158 and/or a one or more fastener 160. The use of braze has the advantage of providing a relative low resistivity connection and can, in accordance with certain embodiments, eliminate the need for fasteners, e.g., one or more fastener 160. In the illustrated exemplary embodiment first module connector 108 includes a first plug body 162, which is configured and adapted to connect electrically to a power module seated in first chassis slot 134 (shown in FIG. 2).

Second module connector buckle 150 is similar to first module connector buckle 146 and is additionally connected on an end of second bus body segment 148 opposite first module connector buckle 146 through second bus body segment 148, and is further connected buckle 150 is fixed to second module connector 110. Fixation of second module connector 110 to second module connector buckle 150 can be through braze 164 and/or one more fastener 166. In the illustrated exemplary embodiment second module connector 110 includes a second plug body 168, which is configured and adapted to connect electrically to a power module seated in second chassis slot 136 (shown in FIG. 2).

Third module connector buckle 154 is also similar to first module connector buckle 146 and is additionally connected on an end of third bus body segment 152 opposite second module connector buckle 150, and is additionally connected electrically therethrough with second module connector buckle 150. Third module connector 112 is fixed to third module connector buckle 154. Fixation of third module connector 112 to third module connector buckle 154 can include braze 170 and/or a fastener 172. In the illustrated exemplary embodiment third module connector 112 includes a third plug body 176, which is configured and adapted to connect electrically to a power module seated in third chassis slot 138 (shown in FIG. 2). Although a flexible bus body 106 having three (3) connector modules is shown in the illustrated exemplary embodiment it is to be understood and appreciated that flexible bus body 106 can have fewer than three connector modules or more than three connector modules, as suitable for an intended application.

Figure 5:
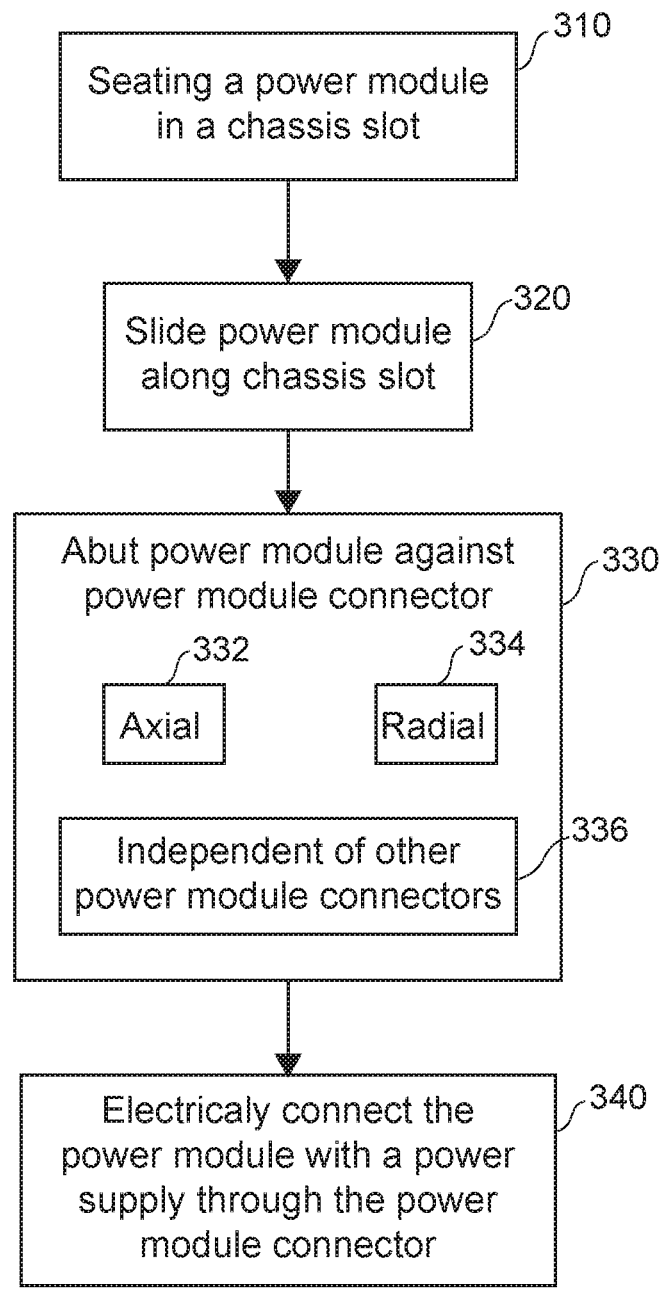
FIG. 5 is a block diagram of a method of seating power modules in a power panel, showing steps of the method.

With reference to FIG. 5, a method 300 of seating a power module in a power panel is shown. Method 300 includes seating a power module, e.g., power module 202 (shown in FIG. 2), in a chassis slot, e.g., first chassis slot 134 (shown in FIG. 2), as shown with box 310. The power module is slid along the chassis slot and abutted against a module connector, e.g., first module connector 108 (shown in FIG. 2), as shown with box 320. As the first module connector is brought into abutment with the module connector the module connect is moved by the sliding movement of the power module, as shown with box 330. The movement of the module connector can be axial relative to the chassis slot, as shown with box 332. Alternatively or additionally, the movement module connector can be radial relative to the chassis slot, as shown with box 334. The movement of the power module can be independent another (or all other) module connectors in the power assembly, as shown with box 336. Once abutted with one another it is contemplated that the module connector seat in the power module, the power module thereby being in electrical communication with a power supply through the bus body, as shown with box 340.

Power panels with power modules mounted in typically include wires or cabling that connect the power module to the power supply. For applications rated to carry relatively high amperages the size and weight of the cabling can require that the power panel be relatively large, potentially limiting the ability of the power panel to be configured as a line replaceable module. In some application bus bars can be employed to limit the size and weight of the power panel. However, such custom bus bars can require custom designs, be relatively expensive, and can be prone to developing hot spots due to side loadings that result from pins misalignment between pins press-fit or soldered into the bus bar and variation in the position of the power module in the power module. Such misalignment can be particularly challenging in power panels with three or more power modules as the misalignment of any one card can result in side loadings in the others, resulting in hot spots in the electrical cabinet during operation.

In embodiments described herein flexible bus bodies are employed that allow the power module connectors to float relative to one another. The floating arrangement of the power module connectors allow any one of the power module connectors to move axially and/or radially relative to the chassis slot seating the power module as the power module is slid along the chassis slot and brought into abutment with the power module connector, avoiding side loading between other power module connectors and power modules in the power module assembly. In certain embodiment the flexible bus bars are brazed to the power module connectors, providing a relatively low resistance joint (nearly zero), limiting thermal loss through the braze fixing the power module connector to the flexible bus body. Radial float can be achieved by the tolerance of the contact to the aperture power panel cover to allow clearance and axial float can achieved by providing space between the cover and the clip that to which the power module connector is fixed.

The methods and systems of the present disclosure, as described above and shown in the drawings, provide for power panels and power panel assemblies with superior properties including flexible bus bars that allow for relatively low side loadings and/or hot spots within the power panel and electrical cabinet. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A power panel for an electrical system, comprising:
    a chassis having chassis slots for power modules;
    a flexible bus body coupled to the chassis to connect the power panel to a power source; and
    first and second module connectors fixed relative to the bus body to connect the power modules to the bus body, wherein the second module connector is movable relative to the first module connector to accommodate position of the power modules in the chassis slots.

2. The power panel as recited in claim 1, wherein the first module connector is radially free and axially free relative to a first of the chassis slots.

3. The power panel as recited in claim 1, wherein the second module connector is radially free and axially free relative to a second of the chassis slots.

4. The power panel as recited in claim 1, wherein the bus body has a flexible body spanning the chassis slots, the flexible body comprising a ribbon stack.

5. The power panel as recited in claim 1, further comprising a terminal arranged on an end of the bus body for connecting the bus body to a power supply, the terminal fixed relative to the chassis.

6. The power panel as recited in claim 5, further comprising a buckle connecting the terminal in series with the bus body, the terminal brazed to the buckle.

7. The power panel as recited in claim 6, wherein the bus body includes a ribbon segment captive within the buckle and electrically connected to the terminal by the buckle.

8. The power panel as recited in claim 1, wherein the first module connector includes a plug body fixed relative to the bus body.

9. The power panel as recited in claim 8, further comprising a buckle connecting the plug body in series with the bus body.

10. The power panel as recited in claim 9, wherein the plug body is brazed to the buckle.

11. The power panel as recited in claim 9, wherein the bus body includes a braided segment captive within the buckle and electrically connected to the plug body by the buckle.

12. The power panel as recited in claim 1, further comprising a cover having plug apertures, the cover enclosing the bus body, the first module connector extending through a first of the plug apertures and movably supported relative to the cover, and the second module connector extending through a second of the plug apertures and movably supported relative to the cover.

13. The power panel as recited in claim 1, further comprising a clip seated about the module connector and axially spaced apart from the cover to provide axial float to the module connector.

14. The power panel as recited in claim 13, wherein the aperture and module connector are tolerance to one another to allow radial float of the module connector relative to the cover.

15. The power panel as recited in claim 1, further comprising a power module seated one of the chassis slots, the power module in electrical communication with the bus body by one of the first and second power module connectors.

16. A electrical cabinet, comprising:
    a power panel as recited in claim 1, wherein the first module connector is radially free and axially free relative to a first of the chassis slots, wherein the second module connector is radially free and axially free relative to a second of the chassis slots, and wherein the bus body has a flexible body spanning the laterally spanning the chassis slots;
    a terminal arranged on an end of the bus body for connecting the bus body to a power supply, the terminal fixed relative to the chassis; and
    a cover having plug apertures, the cover enclosing the bus body, the first module connector extending through a first of the plug apertures and movably supported relative to the cover, and the second module connector extending through a second of the plug apertures and movably supported relative to the cover.

17. The electrical cabinet as recited in claim 16, wherein the first module connector includes a plug body fixed relative to the bus body, wherein the bus body includes a ribbon segment captive within the buckle and electrically connected to the plug body by the buckle.

18. The electrical cabinet as recited in claim 16, wherein the ribbon segment is doubled with another ribbon segment captive within the buckle.

19. The electrical cabinet as recited in claim 16, wherein the ribbon segment includes a singular ribbon segment captive within the buckle.

20. A method of seating a power module in a power panel, comprising:
    at a chassis having chassis slots, a flexible bus body coupled to the chassis, and first and second module connectors fixed relative to the bus body, the second module connector movable relative to the first module connector;
    seating a power module in a first of chassis slots; and
    sliding the power module along the chassis slot and into abutment with the second module connector, wherein sliding the power module includes moving the second module connector relative to the first module connector with the sliding movement of the power module.

\* \* \* \* \*